(12) United States Patent
Brick et al.

(10) Patent No.: US 10,582,585 B2
(45) Date of Patent: Mar. 3, 2020

(54) RADIATION EMITTING DEVICE

(71) Applicant: OSRAM Opto Semiconductors GmbH, Regensburg (DE)

(72) Inventors: Peter Brick, Regensburg (DE); Stefan Grötsch, Bad Abbach (DE); Stephan Pawlik, Regensburg (DE); Michael Wittmann, Alteglofsheim (DE); Uli Hiller, Bad Abbach (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/256,879

(22) Filed: Jan. 24, 2019

(65) Prior Publication Data
US 2019/0230763 A1    Jul. 25, 2019

(30) Foreign Application Priority Data
Jan. 24, 2018 (DE) .................. 10 2018 101 582

(51) Int. Cl.
*H01L 27/14* (2006.01)
*H01L 27/30* (2006.01)
(Continued)

(52) U.S. Cl.
CPC ....... *H05B 33/0857* (2013.01); *H01L 27/153* (2013.01); *H01L 33/44* (2013.01); *H01L 33/50* (2013.01)

(58) Field of Classification Search
CPC ....... H01L 27/153; H01L 33/44; H01L 33/50; H01L 33/502; H01L 33/504;
(Continued)

(56) References Cited

U.S. PATENT DOCUMENTS

2012/0248492 A1* 10/2012 Muller .............. H01L 31/0224
257/99
2013/0075775 A1    3/2013 Haase et al.
(Continued)

FOREIGN PATENT DOCUMENTS

DE    102009034250 A1    1/2011
DE    102014112551 A1    3/2016

OTHER PUBLICATIONS

Dittrich, J., "Electrochromic Glasses, New Technologies for Electricians," Lemen & Lehm, vol. 73, 2004, 17 pages with translation.
(Continued)

*Primary Examiner* — Thai Pham
(74) *Attorney, Agent, or Firm* — Slater Matsil, LLP

(57) ABSTRACT

A radiation emitting device is disclosed. In an embodiment a radiation emitting device includes a pixelated optoelectronic semiconductor chip configured to emit a first radiation having a first peak wavelength, a conversion element or color control medium configured to convert at least a portion of the first radiation into a second radiation having a second peak wavelength and a color control element including a semiconductor diode configured to absorb a portion of the first and/or second radiation, wherein devise is configured to emit radiation of a first color temperature composed mainly of the first and second radiations when a reverse voltage is applied to the semiconductor diode and to emit radiation of a second color temperature composed mainly of the first and second radiations and a third radiation with a third peak wavelength generated by the absorbed first and/or second radiation in the semiconductor diode when a forward voltage is applied to the semiconductor diode.

15 Claims, 5 Drawing Sheets

(51) Int. Cl.
   *H01L 27/32* (2006.01)
   *H01L 33/50* (2010.01)
   *H05B 33/08* (2020.01)
   *H01L 27/15* (2006.01)
   *H01L 33/44* (2010.01)

(58) Field of Classification Search
   CPC ..... H01L 33/507; H01L 25/048; H01L 27/32; H01L 27/14; H01L 27/144; H01H 27/15; H01H 27/30; H01H 27/305
   See application file for complete search history.

(56) References Cited

U.S. PATENT DOCUMENTS

| | | | |
|---|---|---|---|
| 2013/0099266 A1* | 4/2013 | Wittmann | H01L 25/0753 257/98 |
| 2015/0338714 A1 | 11/2015 | Li | |
| 2016/0329470 A1* | 11/2016 | Butendeich | H01L 33/504 |
| 2017/0256691 A1* | 9/2017 | Brick | H01L 33/507 |
| 2017/0309794 A1 | 10/2017 | von Malm | |

OTHER PUBLICATIONS

Kraft, A. et al., "Switchable Electrochromic Filters as Spectrally Selective Light Modulators," Heike Faltz, Institute for Thin Film Technology and Microsensor Technology e.V. (IDM), Teltow, Photonik, Feb. 2007, 11 pages including translation.

* cited by examiner

RADIATION EMITTING DEVICE

CROSS-REFERENCE TO RELATED APPLICATIONS

This application claims the benefit of German patent application 102018101582.8, filed on Jan. 24, 2018, which application is hereby incorporated herein by reference.

TECHNICAL FIELD

A radiation emitting device is specified which is suitable, for example, for illuminating the interior of a vehicle. Here it is important that the lighting is appropriate to the situation, for example, in a certain area of the interior or in a certain color. A different colored illumination can be realized, for example, by the use of several light sources of different colors. However, each additional light source increases the required installation space.

SUMMARY

Embodiments provide a compact radiation emitting device suitable for adaptive illumination.

According to at least one embodiment, the radiation emitting device comprises a pixelated optoelectronic semiconductor chip having a plurality of adjacent semiconductor regions. Each semiconductor region forms exactly one pixel. For example, the semiconductor chip can have an edge length of 4 mm and is divided into 32×32 semiconductor regions, so that each semiconductor region has an edge length of 125 µm. The edge length of the semiconductor regions is preferably in a range between 40 µm and 125 µm. In particular, the semiconductor chip has a semiconductor layer sequence which is composed of a first, in particular n-conducting semiconductor layer, an active zone and a second, in particular p-conducting semiconductor layer, which follow one another in vertical direction. In an advantageous embodiment, the semiconductor layer sequence is structured in at least one lateral direction so that it has several laterally spaced semiconductor regions in the at least one lateral direction. The lateral directions are arranged in a plane whose normal vector is parallel to a vertical direction. In particular, the direction in which the second semiconductor layer follows the first semiconductor layer denotes the vertical direction. In an alternative embodiment, the semiconductor regions are arranged seamlessly, i.e., without lateral spacing between two adjacent semiconductor regions. The semiconductor layer sequence is subdivided into several semiconductor regions by means of a suitable contact structure, which provides a contact medium for electrical contacting for each semiconductor region.

The optoelectronic semiconductor chip may emit a first radiation with a first peak wavelength. The peak wavelength denotes the maximum of the spectral distribution of the radiation. The layers of the semiconductor layer sequence of the semiconductor chip preferably contain at least one III/V semiconductor material, such as a material from the material system $In_xGa_yAl_{1-x-y}N$, which is suitable for generating ultraviolet to blue radiation. Preferably the first radiation is blue radiation with a peak wavelength between 400 nm and 480 nm.

In an advantageous embodiment, the radiation emitting device comprises a conversion element provided for converting at least a portion of the first radiation into a second radiation having a second peak wavelength. For example, the conversion element may be a self-supporting element, such as a ceramic plate formed from converter materials, or a glass plate containing or applied to converter materials. Alternatively, the conversion element can be a potting compound containing, for example, a radiation transmissive material such as silicone and embedded converter materials.

As an alternative to the conversion element, the radiation emitting device may have a color control medium. In particular, the color control medium comprises a semiconductor diode that absorbs a portion of the first radiation and converts it into radiation having a second peak wavelength. In particular, the color control medium resembles the color control element described below.

Preferably the second radiation is green to yellow radiation with a peak wavelength between 550 nm and 580 nm.

According to at least one embodiment, the radiation emitting device further comprises a color control element comprising a semiconductor diode for absorbing a portion of the first and/or second radiation. Preferably, the remaining part of the radiation that is not absorbed by the color control element or semiconductor diode is transmitted through the color control element.

Preferably, in a first operating state, the radiation emitting device emits radiation of a first color temperature composed largely of the first and second radiation. The charge carriers generated in the semiconductor diode are separated by applying a suitable voltage, so that the color control element generates hardly or essentially no radiation. In particular, a reverse voltage is applied to the semiconductor diode of the color control element in the first operating state. Preferably the reverse voltage is higher than −10V and lower than 0V.

In a second operating state, the radiation-emitting device further preferentially emits radiation of a second color temperature which is composed mainly of the first and second radiation and a third radiation with a third peak wavelength generated by the absorbed first and/or second radiation in the semiconductor diode. A radiative recombination of the generated charge carriers takes place in the semiconductor diode by applying a suitable voltage. In particular, in the second operating state, a forward voltage is applied to the semiconductor diode of the color control element. Preferably, the proportion of the third radiation in the total radiation in the second operating condition is greater than in the first operating condition. In particular, the third peak wavelength is greater than the first and second peak wavelengths. Furthermore, the second peak wavelength can be greater than the first peak wavelength. Furthermore, the second color temperature is in particular lower than the first color temperature. In the first operating state, the radiation-emitting device preferably emits radiation with a cold white color temperature, which is in particular at least 4500 K, and in the second operating state it emits radiation with a warm white color temperature, which is in particular at most 4000 K, preferably at 2000 K. The radiation-emitting device preferably emits radiation with a cold white color temperature, which is in particular at least 4500 K, in the first operating state and with a warm white color temperature, which is in particular at most 4000 K, preferably at 2000 K, in the second operating state.

By means of the color control element an adaptive adjustment of the color temperature is possible, wherein the color temperature can be adjusted in the desired way by applying a suitable voltage to the semiconductor diode. The color control element thus replaces another light source and enables a space-saving compact construction of the radiation emitting device.

In an advantageous embodiment, the voltage applied to the semiconductor chip also changes when the operating state of the radiation emitting device changes.

In a further embodiment, the semiconductor diode of the color control element has a semiconductor layer sequence consisting of an n-type semiconductor layer, an active zone, and a p-type semiconductor layer that follow one another in the vertical direction. The semiconductor layer sequence may include a quantum well structure, wherein any structure in which charge carriers can experience a quantization of their energy states by confinement is included in the application. In particular, the designation quantum well structure does not contain any information about the dimensionality of the quantization. It includes among others, quantum troughs, quantum wires and quantum dots and any combination of these structures. The layers of the semiconductor layer sequence preferably contain at least one III/V semiconductor material, such as a material from the material systems $In_xGa_yAl_{1-x-y}As_mP_{1-m}$, each with $0 \leq x$; $y \leq 1$, $x+y \leq 1$ and $0 \leq m \leq 1$. Such III/V semiconductor materials are suitable for generating yellow to red radiation. In addition, II/VI semiconductor materials as well as organic semiconductor materials for the layers of the semiconductor layer sequence can be considered. Preferably the third radiation is yellow to red radiation with a peak wavelength between 580 nm and 620 nm.

According to at least one embodiment, the forward voltage with which the semiconductor diode is operated in the second operating state is smaller than an operational voltage of the semiconductor diode. Preferably the forward voltage is greater than 0V and less than 2V. The third radiation is basically generated by excitation through the absorbed radiation and less through the applied voltage or current flowing through the semiconductor diode.

According to at least one embodiment, the radiation emitting device has a filter element. In particular, the filter element is provided to reflect the third radiation. For example, the filter element can be multi-layered and have alternately arranged dielectric layers of a higher and lower refractive index. Preferably, the filter element is located between the color control element and the conversion element or color control medium. The first and second radiation coming from the semiconductor chip and conversion element or color control medium can be transmitted through the filter element, while the third radiation coming from the color control element is reflected.

According to an alternative embodiment of a radiation emitting device, this comprises a color control element which, instead of the semiconductor diode, has an electrochromic element for changing the transmission of the first and second radiation. In a first operating state the radiation emitting device emits radiation of a first color temperature and in a second operating state radiation of a second color temperature, wherein in the first and second operating states different voltages are applied to the color control element. In accordance with the above embodiment, the radiation emitting device comprises a pixelated optoelectronic semiconductor chip adapted to emit a first radiation having a first peak wavelength and having a plurality of adjacent semiconductor regions. Furthermore, the radiation emitting device comprises a conversion element or color control medium as already described above, which is provided for converting at least part of the first radiation into a second radiation having at least one second peak wavelength, in particular a plurality of second peak wavelengths. A basic principle or possible structure of an electrochromic element is described, for example, in Kraft, A. et al., "Switchable electrochromic filters as spectrally selective light modulators" in Photonik February 2007, 76-78, whose disclosure content, particularly with regard to the mode of operation and construction (see FIG. 1) of the electrochromic element, is herewith i by reference.

With this embodiment an adaptive adjustment of the color temperature is possible by means of the color control element, wherein the color temperature can be adjusted in the desired way by applying a suitable voltage to the electrochromic element. Hereby, the mixed radiation composed of the first and second radiation has a spectral distribution, which in particular also includes the yellow to red spectral range. By changing the voltage at the electrochromic element, the transmittance for different spectral components and thus the color temperature of the radiation transmitted through the color control element changes.

Preferably, the at least one second peak wavelength is greater than the first peak wavelength. For example, the first peak wavelength is in the blue spectral range, while at least a second peak wavelength is in the green to yellow spectral range.

According to at least one embodiment, the semiconductor regions of the pixelated semiconductor chip can be driven individually. In other words, each semiconductor region can be energized independently of the other semiconductor regions. This enables the semiconductor chip to emit pixeled radiation or pixel-fine radiation. So it is possible to limit the emission of radiation to certain solid angles by controlling selected semiconductor regions, especially in conjunction with an optical element downstream of the radiation emitting device in a main radiation direction.

In an advantageous embodiment, the color control element has no pixel structure corresponding to the pixelated semiconductor chip. This means that the color control element in particular is not divided into side-by-side or laterally spaced regions corresponding to the pixels of the semiconductor chip. In particular, the color control element has a uniform thickness and extends across all semiconductor regions without interruption.

Furthermore, the color control element can be so thin that lateral radiation propagation hardly takes place. This allows the radiation emitting device to still emit pixelated radiation even though the color control element has no pixel structure. In particular, the color control element shall have a thickness of at most 30 μm, preferably of at most 10 μm.

In a further embodiment, the conversion element or color control medium does not have a pixel structure corresponding to the pixelated semiconductor chip. This means that the conversion element or color control medium is not divided into adjacent or laterally spaced regions corresponding to the pixels of the semiconductor chip. In particular, the conversion element or color control medium has a uniform thickness and extends uninterruptedly across all semiconductor regions.

The conversion element or color control medium can be so thin that lateral radiation propagation hardly takes place. This makes it possible for the radiation emitting device to emit pixelated radiation even though the conversion element or color control medium has no pixel structure. In particular, the conversion element or color control agent has a thickness of at most 30 μm, preferably of at most 10 μm. Alternatively, the conversion element can be applied pixel-fine in the form of a coating to the semiconductor regions of the semiconductor chip.

According to at least one embodiment, the conversion element or color control medium is arranged on the semiconductor chip. In particular, the conversion element or color control medium is subordinated to the pixel structure of the semiconductor chip in a main radiation direction. For example, the conversion element or color control medium may be attached to the semiconductor chip by a connecting means, such as an adhesion promoter.

In addition, the color control element may be located on a side of the conversion element or color control medium remote from the semiconductor chip. For example, the color control element may be attached to the conversion element or color control medium by a connecting means, such as an adhesion promoter.

In an advantageous configuration, the color control element has radiation absorbing and radiation transmissive regions, the absorption of the first and/or second radiation being greater in the radiation absorbing regions than in the radiation transmissive regions. For example, the radiation transmissive regions may be formed by recesses in the color control element. Preferably the recesses penetrate the color control element completely. The recesses have a diameter that is smaller than the edge length of the pixels of the semiconductor chip and larger than the wavelength of the first, second and third radiation. For example, the diameter can be between 1 µm and 10 µm. Preferably, at least one recess is assigned to each pixel of the semiconductor chip.

With an advantageous embodiment, the radiation emitting device features a circuit element, in particular a silicon chip, for individual control of the semiconductor regions of the pixelated semiconductor chip. In particular, the circuit element has a switch for each semiconductor region, the switches preferably being monolithically integrated in the circuit element. In an advantageous embodiment, the pixelated semiconductor chip is arranged on the circuit element. The circuit element can also be used to drive the color control element. In particular, the control of the semiconductor chip and the control of the color control element are coupled with each other, so that, for example, if the voltage at the color control element changes, the voltage at the semiconductor chip is adjusted.

BRIEF DESCRIPTION OF THE DRAWINGS

Further advantages, preferred embodiments and further developments of the radiation emitting device can be found in the explanations of FIGS. 1 to 6.

Following figures show.

Same, similar or seemingly similar elements are signed in the figures with the same reference signs. The figures and the proportions of the elements illustrated in the figures are not to be regarded as true to scale. Rather, individual elements may be exaggeratedly large for better representability and/or better comprehensibility.

DETAILED DESCRIPTION OF ILLUSTRATIVE EMBODIMENTS

Figure 1:
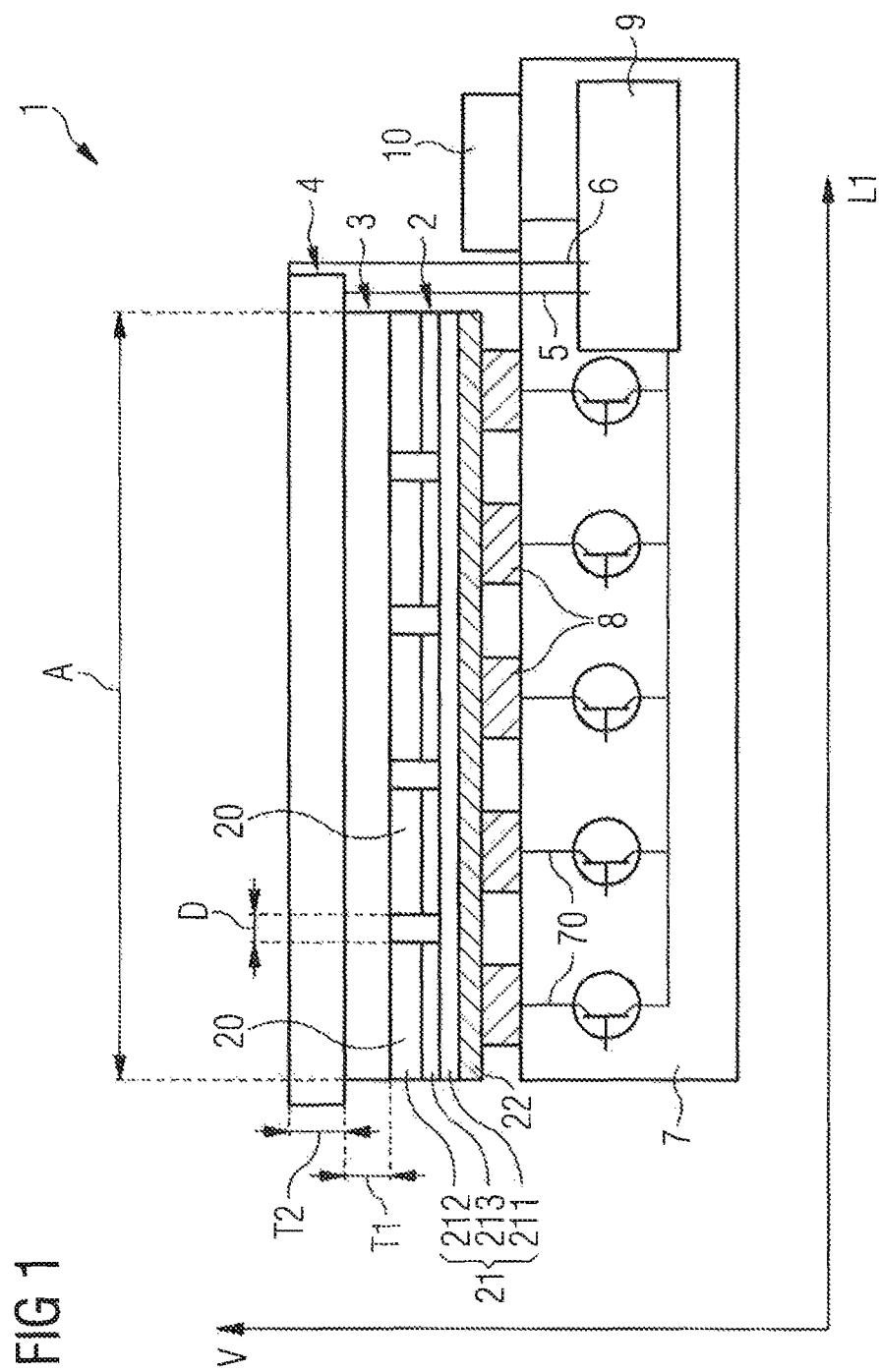
FIG. 1 shows a schematic cross-sectional view of a first embodiment of a radiation emitting device.

FIG. 1 shows a first embodiment of a radiation emitting device 1 comprising a pixelated optoelectronic semiconductor chip 2 having multiple laterally spaced semiconductor regions 20. Each semiconductor region 20 forms exactly one pixel, i.e., a delimited radiation emitting region of the semiconductor chip 2. In particular, the semiconductor regions 20 of the pixelated semiconductor chip 2 can be individually driven. In other words, each semiconductor region 20 can be energized independently of the other semiconductor regions 20. This enables the semiconductor chip 2 to emit pixelated radiation or pixel-fine radiation during operation, so that it is possible to limit the emission of radiation to certain solid angles, in particular in connection with an optical element downstream of the radiation emitting device 1 in a main radiation direction. Preferably, the semiconductor regions 20 are arranged in form of a matrix comprising a plurality of rows and columns (see FIG. 3).

The semiconductor chip 2 comprises a semiconductor layer sequence 21 which is structured in two lateral directions L1, L2, i.e., is provided with interruptions so that it has several laterally spaced semiconductor regions 20. For example, the semiconductor chip 2 can have an edge length A, B (see FIG. 3) of 4 mm each and be divided into 32×32 semiconductor regions 20, so that each semiconductor region 20 has an edge length of 125 µm. The edge length of the semiconductor regions 20 is preferably in a range between 40 µm and 125 µm. A lateral distance D between two adjacent semiconductor regions 20 can be between 0 and 10 µm.

The semiconductor layer sequence 21 consists of a first, preferably n-type, semiconductor layer 211 and a second, preferably p-type, semiconductor layer 212 as well as an active, preferably radiation-emitting, zone 213, which is arranged in a vertical direction V between the first semiconductor layer 211 and the second semiconductor layer 212. The lateral directions L1, L2 are arranged in a plane, whose normal vector is parallel to the vertical direction V. V. The first and second semiconductor layers 211, 212 may contain one or more undoped layers in addition to doped layers. The active zone 213 is a p-n transition zone having one or more layers.

The semiconductor layer sequence 21 can be produced layer by layer on a growth substrate with an epitaxial process, wherein preferably the first semiconductor layer 211 and then the active zone 213 and the second semiconductor layer 212 are applied to the growth substrate first. After the semiconductor layer sequence 21 has been produced, the growth substrate can be at least partially removed and replaced by a replacement carrier, or it can remain in the semiconductor chip 2 as a carrier. The carrier element 22 shown in FIG. 1 may be the growth substrate or a spare carrier or a layer reinforcing the semiconductor layer sequence 21. The layers 211, 212, 213 of semiconductor layer sequence 21 preferably contain at least one III/V semiconductor material, such as a material from the material system $In_xGa_yAl_{1-x-y}N$, which is suitable for generating ultraviolet to blue radiation. Sapphire, SiC and/or GaN are possible materials for the growth substrate.

The active zone 213 is provided to emit a first electromagnetic radiation with a first peak wavelength in the ultraviolet to blue spectral range when the semiconductor chip 2 is in operation. A significant portion of the first radiation generated by the active zone 213 is preferably emitted in a main direction of radiation parallel to the vertical direction V.

The radiation emitting device 1 further comprises a conversion element 3 arranged to convert at least a part of the first radiation into a second radiation having a second peak wavelength.

According to the first example, the conversion element 3 is a self-supporting element, for example, a ceramic plate made of converter materials or a glass plate containing converter materials or on which converter materials are applied. The conversion element 3 is provided with uniform thickness and extends without interruption over all semiconductor regions 20. The conversion element 3 therefore does not have a pixel structure corresponding to the pixelated semiconductor chip 2. Preferably, the conversion element 3 is so thin that lateral radiation propagation hardly takes place. Thus it is possible that the second radiation is also pixelated, although the conversion element 3 has no pixel structure. In particular, the conversion element 3 has a thickness T1 of at most 30 μm, preferably of at most 10 μm. The conversion element 3 is arranged on the semiconductor chip 2, wherein it is subordinated to the pixel structure or the semiconductor regions 20 in the main radiation direction. Preferably a large part of the first radiation enters the conversion element 3 and is absorbed there at least partially by the converter materials of the conversion element 3. The first peak wavelength is preferably in the range of an absorption maximum of the conversion element 3. The converter materials then radiate a second radiation, especially of a larger wavelength. Preferably the second radiation is green to yellow radiation with a peak wavelength between 550 nm and 580 nm. The conversion element 3 can then radiate mixed light composed of the first and second radiation and, in particular, has a cold white color temperature higher than 4500 K.

For example, the conversion element 3 may be attached to the semiconductor chip 2 by connection means (not shown), such as an adhesion promoter.

Furthermore, the radiation emitting device 1 comprises a color control element 4 which is intended to absorb part of the first and/or second radiation. For this purpose, according to the first embodiment, the color control element 4 has a semiconductor diode which, due to its bandgap and a suitable thickness, has absorption maxima in the range of the first and/or second peak wavelength. During operation, the absorbed radiation in the semiconductor diode generates charge carriers. In particular, the semiconductor diode comprises a semiconductor layer sequence (not shown) composed of an n-type semiconductor layer, an active zone, and a p-type semiconductor layer, which follow one another in vertical direction. The layers of the semiconductor layer sequence preferably contain at least one III/V semiconductor material, such as a material from the material systems In$_x$Ga$_y$Al1-x-yAs$_m$P$_{1-m}$, in each case with 0≤x; y≤1, x+y≤1 and 0≤m≤1. In addition, II/VI semiconductor materials and organic semiconductor materials are possible for the layers of the semiconductor layer sequence.

In a first operating state, the charge carriers generated in the semiconductor diode are separated by applying a suitable voltage, so that the color control element 4 generates basically no radiation. In a second operating state, a radiative recombination of the generated charge carriers takes place by applying a suitable voltage. Thereby, the color control element 4 or the semiconductor diode generates a third radiation in the yellow to red spectral range with a peak wavelength between 580 nm and 620 nm. The function of the color control element 4 is described in the following in connection with the FIGS. 4 to 6.

According to the first embodiment, the color control element 4 is a self-supporting element, which is located on a side of the conversion element 3 remote from the semiconductor chip 2. The color control element 4 may be attached to the conversion element 3 by connections means (not shown), such as an adhesion promoter. Like conversion element 3, color control element 4 is provided with uniform thickness and extends without interruptions across all semiconductor regions 20. Thus, the color control element 4 has no pixel structure corresponding to the pixelated semiconductor chip 2. Preferably, the color control element 4 is so thin that lateral radiation propagation hardly takes place. Thus, it is possible that the third radiation is also pixelated, although the color control element 4 has no pixel structure. In particular, the color control element 4 has a thickness T2 of at most 30 μm, preferably of at most 10 μm.

The color control element 4 has a first electrical contact 5 and a second electrical contact 6 for control. In particular, pixel-by-pixel control is not provided.

In addition, the radiation emitting device 1 comprises a circuit element 7, in particular a silicon chip. Preferably the pixelated semiconductor chip 2 is arranged on the circuit element 7, wherein the circuit element 7 serves as carrier. With the circuit element 7, which in particular has for each semiconductor region 20 a transistor 70 or switch 70, respectively, which are preferably monolithically integrated in the circuit element 7, each semiconductor region 20 of the pixelated semiconductor chip 2 can be individually driven. The transistors or switches 70 are used, for example, to switch on, switch off and set the current intensity with which an assigned semiconductor region 20 is energized. The semiconductor regions 20 can be in direct contact with connection points 8 of circuit element 7.

In addition, the circuit element 7 may be provided for driving the color control element 4, wherein the first electrical contact 5 and the second electrical contact 6 of the color control element 4 are electrically connected to the circuit element 7. In particular, the control of the semiconductor chip 2 and the control of the color control element 4 are coupled to each other via an interface 9 of the circuit element 7, so that, for example, if the voltage at the color control element 4 changes, the voltage at the semiconductor chip 2 is adjusted.

In addition, the radiation emitting device 1 may have at least two bond pads 10 for external electrical contacting.

Figure 2:
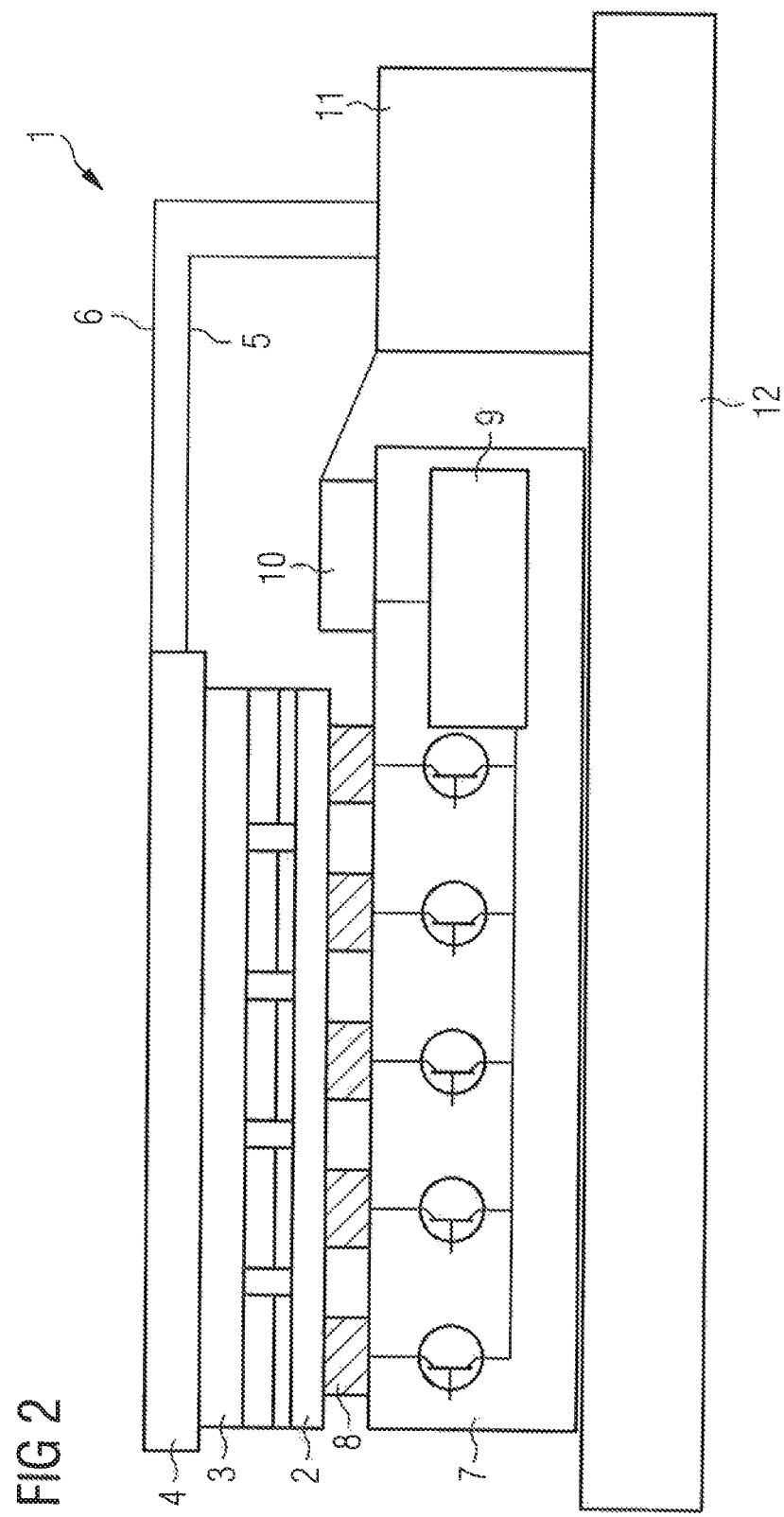
FIG. 2 is a schematic cross-sectional view of a second embodiment of a radiation emitting device and FIG. 3 is a schematic perspective view of a radiation emitting device according to the second embodiment (without color control element)

FIG. 2 shows a second embodiment of a radiation emitting device 1. As in the first embodiment, the device 1 comprises a pixelated semiconductor chip 2, a conversion element 3 downstream of the semiconductor chip 2 in the main radiation direction, and a color control element 4 downstream of the conversion element 3 in the main radiation direction. Furthermore, the radiation emitting device 1 comprises a circuit element 7 on which the pixelated semiconductor chip 2 is arranged. The circuit element 7 is provided for the individual control of the semiconductor regions 20 of the pixelated semiconductor chip 2. In addition, the radiation emitting device 1 has a control device 11 which is provided for driving the color control element 4. Thereby, the circuit element 7 can also be electrically connected to the control device 11, whereby in particular the color control element 4 and the semiconductor chip 2 are not electrically coupled.

Figure 3:
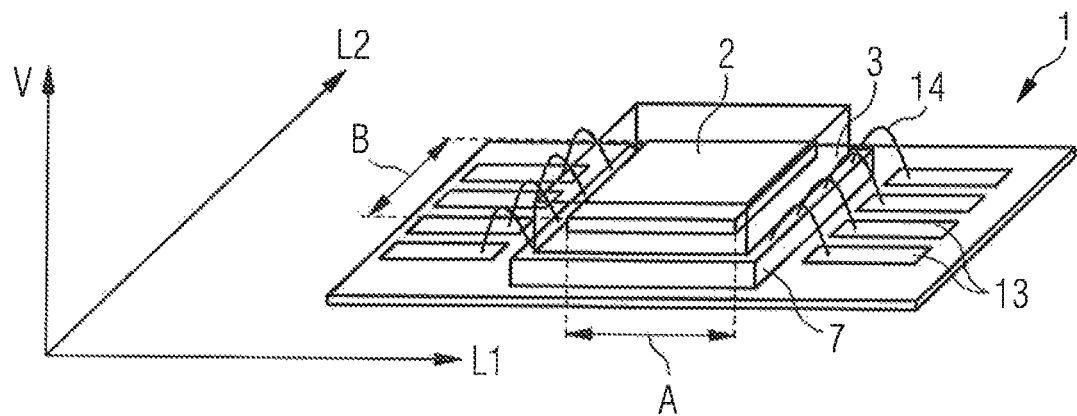

The radiation emitting device 1 comprises a connection carrier 12 on which the circuit element 7 with the further elements 2, 3, 4 arranged thereon and the control device 11 are arranged side by side. As shown in FIG. 3, several bond pads 13 are arranged on the connection carrier 12, of which each is electrically connected to a bond pad 10 arranged on the circuit element 7 with a connecting means, in particular with a bond wire 14.

Figure 4:
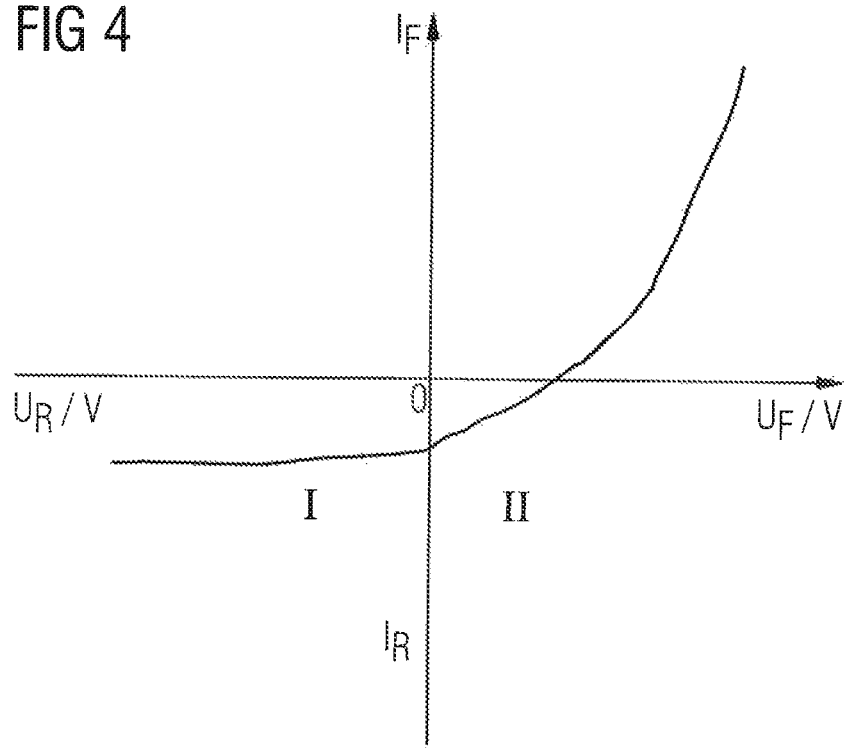
FIG. 4 shows a diagram showing a current-voltage characteristic of a color control element.

Using the current (I) voltage (U) characteristic shown in FIG. 4, the function of the color control element 4 is described in more detail according to the first and second embodiments.

In the first operating state I, a reverse voltage $U_R$ is applied to the semiconductor diode of the color control element 4. Preferably, the reverse voltage $U_R$ is greater than −10 V and less than 0 V. The charge carriers generated in the semiconductor diode by the absorbed radiation are separated, so that the color control element 4 generates hardly or basically no radiation. The remaining part of the radiation that is not absorbed by the color control element 4 or the semiconductor diode is transmitted through the color control element 4. The spectral distribution or the color temperature of the radiation emitted in the first operating state I is explained in connection with FIGS. 5 and 6.

In the second operating state II, a forward voltage $U_F$ is applied to the semiconductor diode of the color control element 4. In particular, the forward voltage $U_F$, with which the semiconductor diode is operated in the second operating state II, is smaller than the operational voltage of the semiconductor diode. Preferably the forward voltage $U_F$ is greater than 0 V and less than 2 V. A radiative recombination of the generated charge carriers takes place in the semiconductor diode. In particular, 70% of the mixed light composed of the first and second radiation is absorbed in the color control element 4, while 30% of the mixed light is transmitted through the color control element 4. The spectral distribution or the color temperature of the radiation emitted in the first operating state I is explained in connection with FIGS. 5 and 6.

Figure 5:
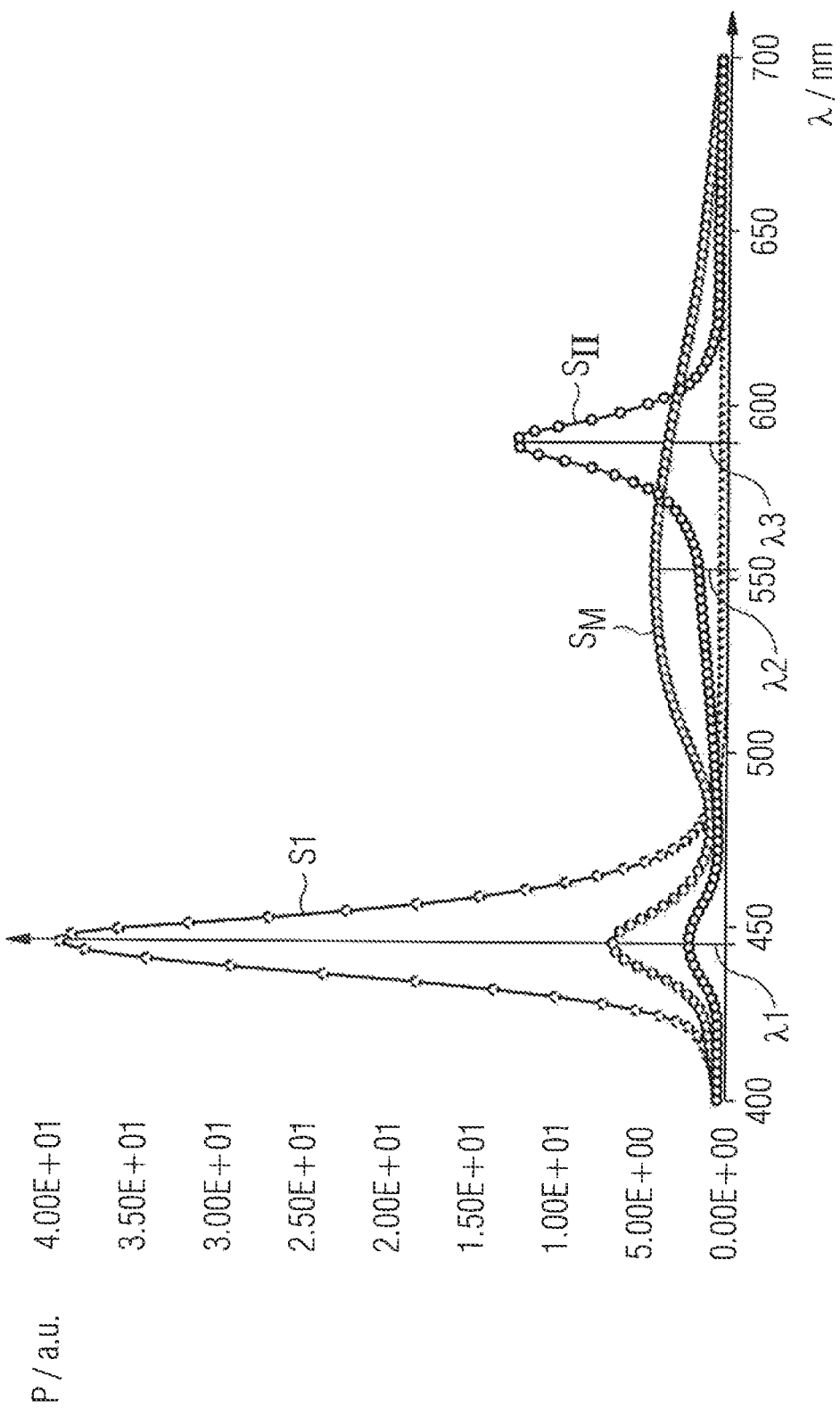
FIG. 5 shows a graph showing the spectral power of the radiation occurring in various elements of a radiation emitting device.

FIG. 5 shows the spectral power P of the first radiation S1 emitted by the optoelectronic semiconductor chip 2 (see FIGS. 1 to 3) during operation. The first radiation S1 is blue radiation (see FIG. 6) with a first peak wavelength $\lambda 1$ between 400 nm and 480 nm. The radiation power of the first radiation S1 is in particular 952 mW.

Figure 6:
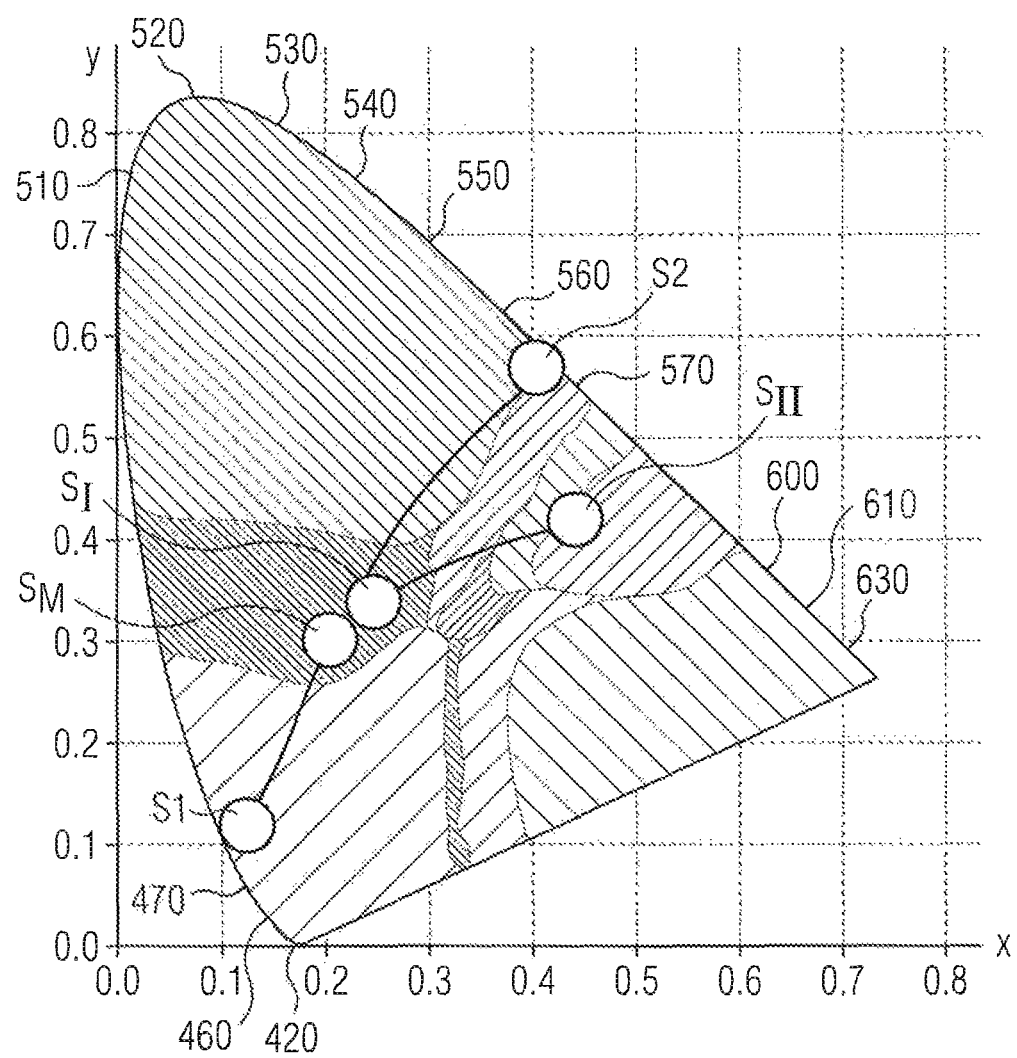
FIG. 6 shows a color diagram showing the color temperatures of the radiation occurring in various elements of a radiation emitting device.

FIG. 5 also shows the spectral power P of the mixed radiation $S_M$, which is composed of the first radiation S1 and the second radiation S2 generated in the conversion element 3 (see FIG. 6). Preferably, the second radiation S2 is green to yellow radiation with a peak wavelength $\lambda 2$ between 550 nm and 580 nm. The mixed radiation $S_M$ resulting from the first and second radiation S1, S2 shows a cold white color temperature, which is higher than 4500 K in particular. The radiation power of the mixed radiation $S_M$ is in particular 715 mW.

Furthermore, FIG. 5 shows the spectral power P of the device 1 emitting radiation in the second operating state II (see FIG. 4) of the emitted radiation $S_{II}$. This consists of the first and second radiation S1, S2 as well as the third radiation generated by the absorbed first and second radiation S1, S2 in the semiconductor diode with a third peak wavelength $\lambda 3$. The third peak wavelength $\lambda 3$ is greater than the first and second peak wavelength $\lambda 1$, $\lambda 2$. Preferably the third radiation is yellow to red radiation, whereby the third peak wavelength $\lambda 3$ is between 580 nm and 620 nm. For example, 70% of the mixed radiation $S_m$ can be absorbed in the color control element 4 and 30% can be transmitted through the color control element 4. At a conversion efficiency of the color control element 4 of 50%, i.e., the ratio of the energy of the third radiation to the energy of the absorbed mixed radiation $S_m$, radiation $S_{II}$ with a power of about 453 mW is emitted by the radiation emitting device 1 in the second operating state II (see FIG. 4).

As shown in FIG. 6, the radiation $S_{II}$ emitted by the radiation-emitting device 1 in the second operating state II has a warm white color temperature, which in particular is at most 4000 K, preferably at 2000 K. Furthermore, in the first operating state I, the radiation emitting device 1 emits a radiation $S_I$ with a cold white color temperature, which is in particular at least 4500 K, and preferably lower than the color temperature of the mixed radiation $S_M$.

With the color control element 4 an adaptive adjustment of the color temperature is possible, wherein by applying a suitable voltage to the color control element 4 or the semiconductor diode, namely a reverse voltage UR or a forward voltage UF, in particular below the operational voltage, the color temperature can be adjusted accordingly.

The invention is not limited by the description of the embodiments. Rather, the invention includes any new feature and any combination of features, which in particular includes any combination of features in the patent claims, even if that feature or combination itself is not explicitly mentioned in the patent claims or embodiments.

What is claimed is:

1. A radiation emitting device comprising:
   a pixelated optoelectronic semiconductor chip configured to emit a first radiation having a first peak wavelength, the pixelated optoelectronic semiconductor chip comprising a plurality of adjacent semiconductor regions;
   a conversion element or a color control medium configured to convert at least a portion of the first radiation into a second radiation having a second peak wavelength; and
   a color control element comprising a semiconductor diode configured to absorb a portion of at least one of the first radiation or the second radiation,
   wherein the radiation emitting device is configured to:
      emit radiation of a first color temperature composed mainly of the first and second radiations when a reverse voltage is applied to the semiconductor diode in a first operating state; and
      emit radiation of a second color temperature composed mainly of the first and second radiations and a third radiation with a third peak wavelength generated by the at least one absorbed first radiation or the absorbed second radiation in the semiconductor diode when a forward voltage is applied to the semiconductor diode in a second operating state.

2. The radiation emitting device according to claim 1, wherein the forward voltage is less than an operational voltage of the semiconductor diode.

3. The radiation emitting device according to claim 1, further comprising a filter element for reflecting the third radiation disposed between the color control element and the conversion element or the color control medium.

4. The radiation emitting device according to claim 1, wherein the third peak wavelength is greater than the first and second peak wavelengths.

5. The radiation emitting device according to claim 1, wherein the conversion element or the color control medium or the color control element does not have a pixel structure corresponding to the pixelated optoelectronic semiconductor chip and is so thin that lateral radiation propagation is substantially inhibited.

6. The radiation emitting device according to claim 1, wherein the semiconductor regions of the pixelated optoelectronic semiconductor chip are individually controllable so that the pixelated optoelectronic semiconductor chip is suitable for pixel-fine radiation emission.

7. A radiation emitting device comprising:
a pixelated optoelectronic semiconductor chip configured to emit a first radiation having a first peak wavelength, the pixelated optoelectronic semiconductor chip comprising a plurality of semiconductor regions arranged next to one another;
a conversion element or a color control medium configured to convert at least a portion of the first radiation into a second radiation having at least a second peak wavelength; and
a color control element comprising an electrochromic element configured to change transmission of the first and second radiations,
wherein the conversion element or the color control medium or the color control element has no pixel structure corresponding to the pixelated optoelectronic semiconductor chip and is so thin that lateral radiation propagation is substantially inhibited,
wherein the radiation emitting device is configured to emit radiation of a first color temperature in a first operating state and to emit radiation of a second color temperature in a second operating state, and
wherein different voltages are applied to the color control element in the first and second operating states.

8. The radiation emitting device according to claim 7, wherein the second peak wavelength is greater than the first peak wavelength.

9. The radiation emitting device according to claim 7, wherein the color control element has a thickness of at most 30 μm.

10. The radiation emitting device according to claim 7, wherein the conversion element or the color control medium is arranged on the pixelated optoelectronic semiconductor chip, and wherein the color control element is arranged on a side of the conversion element or the color control medium remote from the pixelated optoelectronic semiconductor chip.

11. The radiation emitting device according to claim 7, wherein the color control element has radiation absorbing and radiation transmissive regions, and wherein absorption of at least one of the first radiation or the second radiation in the radiation absorbing regions is greater than in the radiation transmissive regions.

12. The radiation emitting device according to claim 11, wherein the radiation transmissive regions are formed by recesses in the color control element.

13. The radiation emitting device according to claim 7, wherein the radiation emitting device is configured to emit radiation with a cold white color temperature in the first operating state and radiation with a warm white color temperature in the second operating state.

14. The radiation emitting device according to claim 7, further comprising a circuit element for driving the semiconductor regions of the pixelated optoelectronic semiconductor chip, wherein the pixelated optoelectronic semiconductor chip is arranged on the circuit element.

15. A method for operation a radiation emitting device for emitting radiation of a first color temperature in a first operating state and for emitting radiation of a second color temperature in a second operating state, wherein the radiation emitting device comprises a pixelated optoelectronic semiconductor chip for emitting a first radiation having a first peak wavelength, the pixelated optoelectronic semiconductor chip comprising a plurality of semiconductor regions arranged next to one another, a conversion element or a color control medium for converting at least a portion of the first radiation into a second radiation having at least a second peak wavelength and a color control element comprising an electrochromic element for changing transmission of the first and second radiations, wherein the conversion element or the color control medium or the color control element has no pixel structure corresponding to the pixelated optoelectronic semiconductor chip and is so thin that radiation propagation is substantially inhibited, the method comprising:
applying a first voltage to the color control element in the first operating state; and
applying a second voltage to the color control element in the second operating state, wherein the first and second voltages are different.

* * * * *